(12) United States Patent
Doan et al.

(10) Patent No.: US 7,408,250 B2
(45) Date of Patent: Aug. 5, 2008

(54) MICROMIRROR ARRAY DEVICE WITH COMPLIANT ADHESIVE

(75) Inventors: Jonathan Doan, Mountain View, CA (US); Terry Tarn, San Diego, CA (US)

(73) Assignee: Texas Instruments Incorporated, Dallas, TX (US)

( * ) Notice: Subject to any disclaimer, the term of this patent is extended or adjusted under 35 U.S.C. 154(b) by 386 days.

(21) Appl. No.: 11/100,104

(22) Filed: Apr. 5, 2005

(65) Prior Publication Data

US 2006/0220045 A1  Oct. 5, 2006

(51) Int. Cl.
H01L 23/02 (2006.01)

(52) U.S. Cl. ............... 257/678; 257/684; 257/E23.188; 257/E23.193

(58) Field of Classification Search ................. 257/678, 257/680, 684, E23.188, E23.193
See application file for complete search history.

(56) References Cited

U.S. PATENT DOCUMENTS

| | | | |
|---|---|---|---|
| 4,178,077 A | 12/1979 | Te Velde | |
| 4,309,242 A | 1/1982 | Te Velde | |
| 5,010,233 A | 4/1991 | Henschen et al. | |
| 5,175,409 A | 12/1992 | Kent | |
| 5,293,511 A | 3/1994 | Poradish et al. | |
| 5,527,744 A | 6/1996 | Mignardi et al. | |
| 5,621,162 A | 4/1997 | Yun et al. | |
| 5,702,764 A | 12/1997 | Kimuara et al. | |
| 5,835,256 A | 11/1998 | Huibers | |
| 5,872,046 A | 2/1999 | Kaeriyama et al. | |
| 5,915,168 A | 6/1999 | Salatino et al. | |
| 5,952,572 A | 9/1999 | Yamashita et al. | |
| 5,963,289 A | 10/1999 | Stefanov et al. | |
| 5,998,242 A | 12/1999 | Kirkpatrick et al. | |
| 6,046,840 A | 4/2000 | Huibers | |
| 6,072,236 A | 6/2000 | Akram et al. | |
| 6,164,837 A | 12/2000 | Haake et al. | |
| 6,165,885 A | 12/2000 | Gaynes et al. | |
| 6,207,548 B1 | 3/2001 | Akram et al. | |
| 6,232,150 B1 | 5/2001 | Lin et al. | |
| 6,252,229 B1 | 6/2001 | Hays et al. | |
| 6,265,246 B1 | 7/2001 | Ruby et al. | |

(Continued)

FOREIGN PATENT DOCUMENTS

EP    1097901 A2    5/2001

(Continued)

OTHER PUBLICATIONS

Y.T. Cheng, et al.,"Localized Silicon Fusion and Eutectic Bonding for MEMS Fabrication and Packaging", Journal of Microelectromechanical Systems, vol. 9, No. 1, Mar. 2000, pp. 3-8.

(Continued)

*Primary Examiner*—Brook Kebede
(74) *Attorney, Agent, or Firm*—Wade James Brady, III; Frederick J. Telecky, Jr.

(57) ABSTRACT

A microstructure is packaged with a device substrate of the microstructure being attached to a package substrate. For dissipating possible deformation of the microstructure, which may result in device failure or quality degradation of the microstructure, an adhesive material comprising a compliant adhesive component is applied and positioned between the device substrate and package substrate.

57 Claims, 3 Drawing Sheets

U.S. PATENT DOCUMENTS

| | | | |
|---|---|---|---|
| 6,287,940 | B1 | 9/2001 | Cole et al. |
| 6,297,072 | B1 | 10/2001 | Tilmans et al. |
| 6,303,986 | B1 | 10/2001 | Shook |
| 6,323,550 | B1 | 11/2001 | Martin et al. |
| 6,353,492 | B2 | 3/2002 | McClelland et al. |
| 6,458,627 | B1 | 10/2002 | Choi |
| 6,459,523 | B2 | 10/2002 | Ueda |
| 6,528,344 | B2 | 3/2003 | Kang |
| 6,541,832 | B2 | 4/2003 | Coyle |
| 6,614,003 | B2 | 9/2003 | Hembree et al. |
| 6,624,003 | B1 | 9/2003 | Rice |
| 6,649,446 | B1 | 11/2003 | Goetz et al. |
| 6,661,084 | B1 | 12/2003 | Peterson et al. |
| 6,674,159 | B1 * | 1/2004 | Peterson et al. ............. 257/680 |
| 6,704,131 | B2 | 3/2004 | Liu |
| 6,791,735 | B2 | 9/2004 | Stappaerts |
| 6,810,899 | B2 | 11/2004 | Franz et al. |
| 6,900,072 | B2 | 5/2005 | Patel et al. |
| 6,953,985 | B2 * | 10/2005 | Lin et al. .................... 257/659 |
| 2001/0007372 | A1 | 7/2001 | Akram et al. |
| 2001/0022207 | A1 | 9/2001 | Hays et al. |
| 2001/0034076 | A1 | 10/2001 | Martin |
| 2001/0040675 | A1 | 11/2001 | True et al. |
| 2001/0048064 | A1 | 12/2001 | Kitani |
| 2002/0063322 | A1 | 5/2002 | Robbins et al. |
| 2002/0117728 | A1 | 8/2002 | Brosnihhan et al. |
| 2002/0146200 | A1 | 10/2002 | Kudrie et al. |
| 2002/0180016 | A1 | 12/2002 | Shrauger et al. |
| 2003/0000737 | A1 | 1/2003 | Liu et al. |
| 2003/0008477 | A1 | 1/2003 | Kang et al. |
| 2003/0047533 | A1 | 3/2003 | Reid et al. |
| 2003/0089394 | A1 | 5/2003 | Chang-Chien et al. |
| 2003/0161027 | A1 | 8/2003 | Kurosawa et al. |
| 2003/0211654 | A1 | 11/2003 | Kocian et al. |
| 2004/0035840 | A1 | 2/2004 | Koopmans |
| 2004/0067604 | A1 | 4/2004 | Ouellet et al. |
| 2004/0119143 | A1 | 6/2004 | Karpman |
| 2004/0190112 | A1 | 9/2004 | Huibers |
| 2004/0232535 | A1 | 11/2004 | Tarn |
| 2005/0101059 | A1 | 5/2005 | Yang |

FOREIGN PATENT DOCUMENTS

| | | |
|---|---|---|
| EP | 1101730 A2 | 5/2001 |
| EP | 1167281 A2 | 1/2002 |
| JP | 2001129800 A | 5/2001 |
| JP | 2001144117 A | 5/2001 |
| JP | 2001196484 A | 7/2001 |
| WO | WO-01/10718 A1 | 2/2001 |
| WO | WO-01/20671 A1 | 3/2001 |
| WO | WO-02/12116 A2 | 2/2002 |
| WO | WO-02/12116 A3 | 2/2002 |

OTHER PUBLICATIONS

Liwei Lin, "MEMS Post-Packaging by Localized Heating and Bonding", 2000 IEEE, pp. 608-616.
Farhad Sarvar, et al., Application of Adhesives in MEMS and MOEMS Assembly: A Review, IEEE Polytronic 2002 Conference, pp. 22-28.
Seong-A Kim, et al., "Closed Loop Solder-Lines on Heated Substrates", 2002 Electronic Components and Technology Conference, pp. 1101-1105.
Giles Huimpston and David M. Jacobson, "Principles of Soldering and Brazing", ASM International, pp. 242-245-7.3.2.3 Solution.
Balaji Sridharan, et al., Post-Packaging Release a New Concept for Surface Micromachined Devices, Mechanical and Aerospace Engineering Department, 4 pgs.
U. Gosele, et al., Wafer Bonding for Microsystems Technologies, Sensors and Actuators 74 (1999) pp. 161-168.
Masao Segawa, et al., A CMOS Inage Sensoer Module Applied for a Digital Still Camera Utilizing the Tab on Glass (TOG) Bonding Method, IEEE Transactions on Advanced Packaging, vol. 22, No. 2.
In-Byeong Kang, et al., The Application of Anisotropic Conductive Films for Realisation of Interconnects in Micromechanical Structures, SPIE vol. 3321, pp. 233-238.
Sonja van der Groen, et al., CMOS Compatible Wafer Scale Adhesive Bonding for Circuit Transfer, International Conference on Solid-State Sensors and Actuators, Chicago, Jun. 16-19, 1997, pp. 629-632.
G. Blink, et al., Wafer Bonding With an Adhesive Coating, Part of the SPIE Conference on Micromachined Devices and Components IV, Santa Clara, California, Sep. 1998, pp. 50-61.
Christine Kallmayer, et al., A New Approach to VHIP Size Package Using Meniscus Soldering and FPC-Bonding, IEEE Transactions on Components Packaging and Manufacturing Technology-Part C., vol. 21, No. 1., Jan. 1998, pp. 51-56.
Joachim Kloeser, et al., Low Cost Bumping by Stencil Printing: Process Qualification for 200 UM Pitch, 1998 International Synposium on Microelectronics, 11 Pgs.
Michel M. Maharbiz, et al., Batch Micropackaging by Conpression-Bonded Wafer-Wafer Transfer, Microassembly Technologies, Inc, 8 Pgs.
Bharat Shivkumar, et al., Microrivets for MEMS Packaging:Concept, Fabriaction, and Strength Testing, Journal of Microlectroomechanical Systems, vol. 6, No. 3, Sep. 1997, pp. 217-224.
Hideki Takagi, et al., Room Temperature Silicon Wafer Direct Bonding in Vacuum by Ar Beam Irradiation, Mechanical Engineering Laboratory, AIST. MITI., 6 Pgs.
Michael H. Beggans, et al., Optical Pressure Sensor Head Fabrication Using Ultra-Thin Silicon Wafer Anodic Bonding, Part of the Symposium on Design, Test, and Microfabrication of MEMS and MOEMS, 10 Pgs.
T.P Glenn, et al., Designing MEMS into Systems:Packaging Issues, http://www.ecnmag.com, 4 Pgs.
Kwon Sang Jik et al., Vacuum In-line Sealing Technology with Auxiliary Heating Line for PDP Packaging, p. 320, Society for Information Display Digest 2002.
Espinosa et al., "Identification of Residual Stress State in an RF-MEMS Device", MTS Systems Corporation white paper (May 2000).
Franka et al., "Solder Bump Technology: Present and Future", Semiconductor Fabtech (May 1995).
Glenn et al., "Packaging Microscopic Machines", Machine Design (Dec. 7, 2000).
Harsh et al., "Flip-Chip Assembly for Si-Based MEMS", Proceedings of the 1999 IEEE International Conference on Microelectromechanical Systems (MEMS '99), Orlando, FL (Jan. 17-21, 1999), pp. 273-278.
Irwin et al., "Quick Prototyping of Flip Chip Assembly with MEMS", University of Colorado at Boulder white paper (Jul. 17, 2000).
Irwin et al., "Quick Prototyping of Flip-Chip Assembly with MEMS", portions of slide presentation from the NSF Center for Advanced Manufacturing and Packaging of Microwave, Optical and Digital Electronics at the University of Colorado at Boulder (1998).
Lee et al., "High-Q Tunable Capacitors and Multi-way Switches Using MEMS for Millimeter-Wave Applications", portions of slide presentation from the NSF Center for Advanced Manufacturing and Packaging of Microwave, Optical and Digital Electronics at the University of Colorado at Boulder (Sep. 1998).
Lee et al., "Use of Foundry Services to Prototype MEMS for Millimeter-wave Applications", portions of slide presentation from the NSF Center for Advanced Manufacturing and Packaging of Microwave, Optical and Digital Electronics at the University of Colorado at Boulder (1998).
Luxbacher, T., "Spray Coating for MEMS, Interconnect & Advanced Packaging Applications", HDI Magazine (May 1999) (abstract only).
Moore, D., "Automation Requirements for Die Bonding Process", Electronics Engineer (Jul. 2000).
Tsau, C., "Wafer-Level Packaging", MIT Microsystems Technology Laboratories Annual Report (May 2000), p. 49.
Michael J. Hodgin, et al., Advanced Boron Nitride Epoxy Formulations Excel in Thermal Management Applications, Nepcon West 1999 Conference, Feb. 23-25, pp. 359-366.
US 6,724,518, 04/2004, Meyer et al. (withdrawn)

* cited by examiner

MICROMIRROR ARRAY DEVICE WITH COMPLIANT ADHESIVE

TECHNICAL FIELD OF THE INVENTION

The invention is related generally to the art of microstructures, and more specifically, to micromirror-based spatial light modulators.

BACKGROUND OF THE INVENTION

Microstructures such as microelectromechanical systems (e.g. micromirror devices, micromirror array devices, liquid crystal displays, and liquid crystal on silicon displays) are often fabricated on one or more substrates. For protection purposes, the microstructures are often packaged. A typical packaging often includes attachment of electrical connections (e.g. wire-bonding), environmental control (e.g. by hermetically sealing in an inert environment), physical protection of the microstructure (e.g. by encasing the microstructure in hard, strong materials), and alignment of the microstructure (e.g. to fixed alignment marks on the package). Part of this process is the bonding of the substrate of the microstructure to the package substrate with a die-attach adhesive. Due to built in stresses in the die, the adhesive, and the package, or due to thermally generated stresses (i.e. those arising from CTE mismatches of the components coupled with a temperature change), forces can be applied to the microstructure. In general such forces will cause deformation of the microstructure, which in turn leads to degradation in performance, even device failure of the microstructure especially when the deformation exceeds a tolerable amount.

Moreover, in those microstructures having multiple substrates, a uniform gap between two substrates is often required for ensuring desired functions or performance of the microstructure. The gap uniformity can not be guaranteed in the presence of such deformation.

Therefore, a method and apparatus for manufacturing microstructures that reduce the quality and performance degradation due to deformation are desired.

SUMMARY OF THE INVENTION

In view of the foregoing, the present invention provides a method and apparatus of producing microstructures in packages comprising the use of compliant die-attach adhesives so as to reduce quality and performance degradation due to deformation from the package and the substrates of the microstructure.

In an embodiment of the invention, a packaged device is disclosed. The device comprises: a microstructure device having a device substrate; a package substrate on which the microstructure device is attached; and an adhesive layer disposed between the device substrate and the package substrate for bonding the two substrates, wherein the adhesive layer comprises a compliant adhesive component having a modulii of 2 GPa or lower.

In another embodiment of the invention, a projection system is disclosed. The system comprises: an illumination system providing illumination light for the projection system; a spatial light modulator having an array of micromirrors; and a display target on which reflected light from the spatial light modulated is projected.

In yet another embodiment of the invention, a method of packaging a microstructure device having a device substrate with a package having a package substrate is disclosed. The method comprises: preparing an adhesive material comprising a compliant adhesive component having a modulus of 2 GPa or lower; depositing the prepared adhesive material to either one or both of the device substrate and the package substrate; and bonding the device substrate to the package substrate with the deposited adhesive material.

In yet another embodiment of the invention, a spatial light modulator is disclosed. The spatial light modulator comprises: an array of microstructure devices having a device substrate; a package substrate on which the microstructure device is attached; and an adhesive layer disposed between the device substrate and the package substrate for bonding the two substrates, wherein the adhesive layer comprises a compliant adhesive component having a modulii of 2 GPa or lower.

The objects and advantages of the present invention will be obvious, and in part appear hereafter and are accomplished by the present invention. Such objects of the invention are achieved in the features of the independent claims attached hereto. Preferred embodiments are characterized in the dependent claims.

BRIEF DESCRIPTIONS OF THE DRAWINGS

While the appended claims set forth the features of the present invention with particularity, the invention, together with its objects and advantages, may be best understood from the following detailed description taken in conjunction with the accompanying drawings of which:

DETAILED DESCRIPTION OF THE INVENTION

The present invention will be discussed in the following with reference to micromirror-based spatial light modulators. It will be appreciated that the following discussion is for demonstration purposes only, and should not be interpreted as a limitation to the scope of the invention. Instead, the invention can be applied to any microstructures form on substrates that are attached and bonded to packages for protection.

Figure 1:
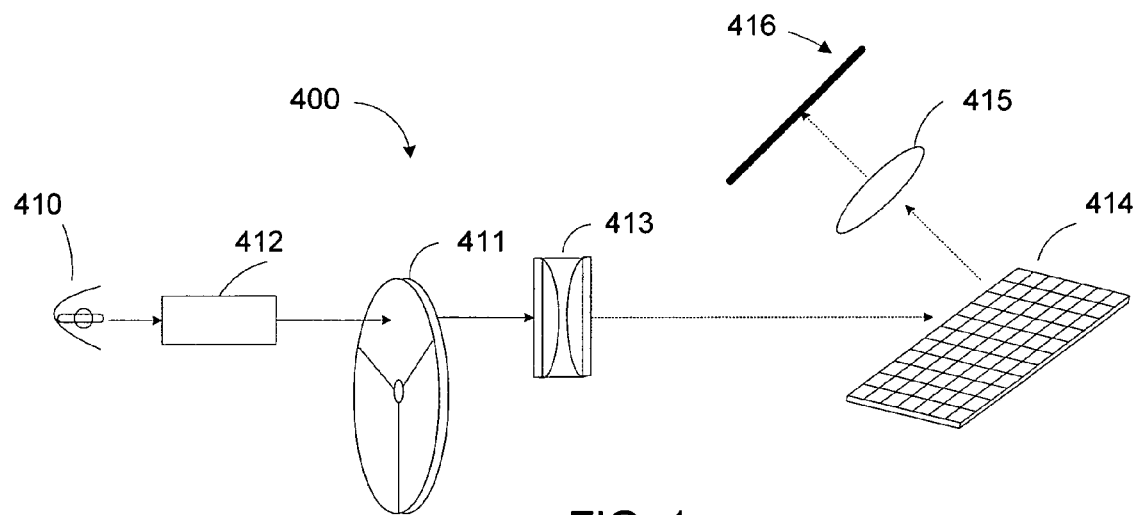
FIG. 1 is a diagram that schematically illustrates an exemplary display system employing a spatial light modulator having an array of micromirrors.

Turning to the drawings, FIG. 1 illustrates an exemplary display system employing a spatial light modulator having a packaged micromirror array device in which embodiment of the invention can be implemented. In its basic configuration, display system 400 comprises light source 410, optical devices (e.g. light pipe 412, condensing lens 413 and projection lens 415), display target 416 and spatial light modulator 414 that further comprises a plurality of micromirror devices (e.g. an array of micromirrors). Light source 410 (e.g. an arc lamp) emits light through the color wheel 411, the light integrator/pipe 412, and condensing lens 413 and onto spatial light modulator 414. Though the color wheel is positioned after the light pipe in this example, the color wheel may be positioned before the light pipe as well. The micromirrors of the spatial light modulator 414 are actuated selectively by a controller (e.g. as disclosed in U.S. Pat. No. 6,388,661 issued May 14, 2002, incorporated herein by reference) so as to reflect—when in their "ON" position—the incident light into projection optics 415, resulting in an image on display target 416 (screen, a viewer's eyes, a photosensitive material, etc.).

Generally, more complex optical systems are often used, especially in displaying applications for color images.

The micromirror array device of the spatial light modulator may have different configurations and can be fabricated in many ways, as those set forth in U.S. Pat. Nos. 5,835,256 and 6,046,840 both to Huibers, and U.S. patent applications Ser. No. 10/366,297 filed Feb. 12, 2003, Ser. No. 10/627,302 filed Jul. 24, 2003, Ser. No. 10/627,155 filed Jul. 24, 2003, Ser. No. 10/613,379 filed Jul. 3, 2003, Ser. No. 10/627,303 filed Jul. 24, 2003, Ser. No. 10/437,776 filed May 13, 2003, and Ser. No. 10/698,563 field Oct. 30, 2003, the subject matter of each being incorporated herein by reference.

Figure 2A:
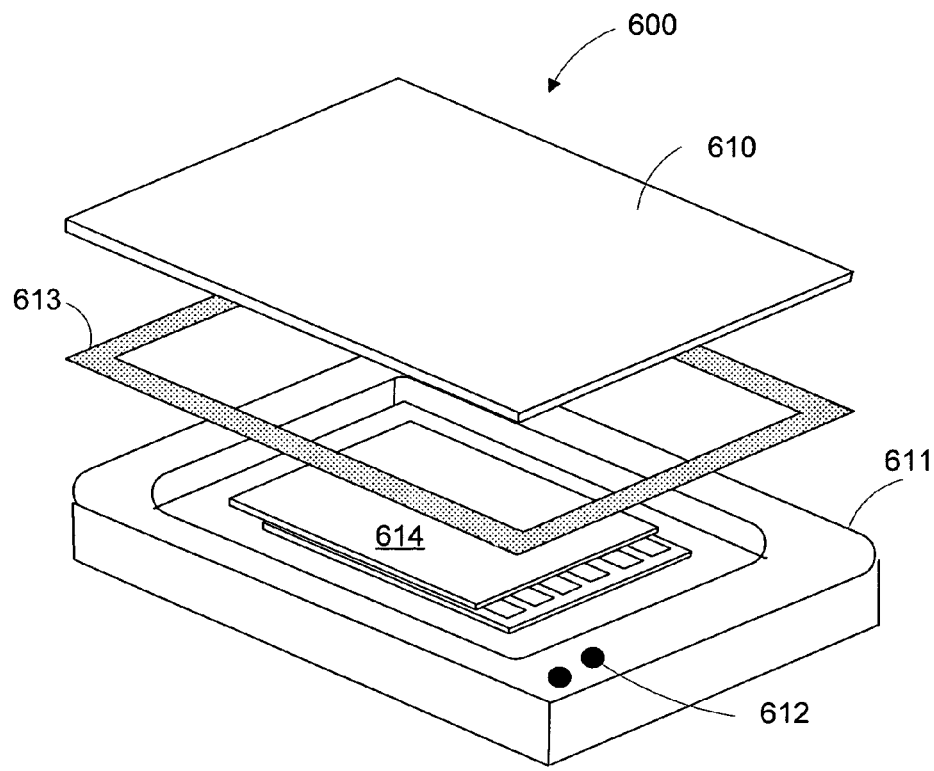
FIGS. 2a and 2b illustrate one embodiment of a package for a micromirror array device, using a perspective view and a cross-sectional view.

For protection purposes, the micromirror array device of the spatial light modulator in FIG. 1 is often packaged. An example of packaged micromirror array device is illustrated in FIG. 2a and detailed in U.S. patent application Ser. No. 10/443,318 to Tarn filed May 22, 2003, the subject matter being incorporated herein by reference. Other packaging apparatus and method are also applicable, such as that set forth in U.S. patent applications Ser. No. 10/698,656 to Tarn filed Oct. 30, 2003, the subject matter being incorporated herein by reference.

Figure 2B:
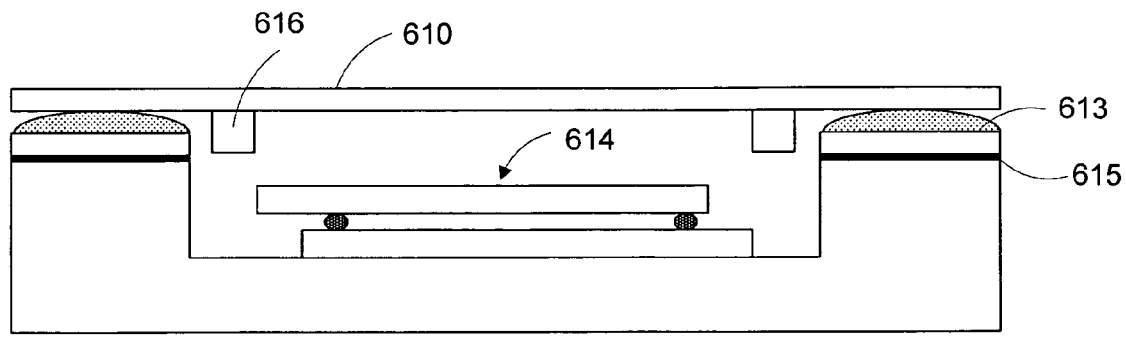

In micromirror array package 600 as shown in FIG. 2a, micromirror array device 614 is attached to the supporting surface of a cavity of packaging substrate 611, which may comprise integral heater (e.g. heater 615 in FIG. 2b). A double substrate type micromirror array device is illustrated herein, however, a single substrate device (e.g. both micromirrors and addressing electrodes formed on one single silicon wafer) or any other microelectromechanical devices could be used. The invention is also applicable to many other packaged electronics devices, and to a variety of light emitting, modulating, and detecting devices. Package cover 610, which is preferably transmissive to the illumination light to be modulated, is bonded to the package substrate via sealing medium 613 for sealing the micromirror array device within the cavity.

In according to an embodiment of the invention, package substrate 611 comprises an integral heater (e.g. heater 615 in FIG. 2b). In another embodiment of the invention, such a heater is not present. During the bonding process, an electric current is driven through the integral heater via two heater leads 612 for generating localized heat. Though cover substrate 610 is preferably visible light transparent glass, it may also be other materials, such as metals or materials that are not transparent to visible light. Alternatively, cover substrate 610 may have an opening forming window with a light transparent glass mounted on the window for allowing transmission of incident light. Moreover, a light blocking mask with light blocking strips formed around the circumference of the mask may be applied along cover substrate 610 for blocking incident light shining on the surface of the micromirror array device.

In the above example, package substrate has a cavity in which the microstructure is located; and the package cover is bonded to the package substrate with the sealing medium. Alternatively, the package substrate can be a flat substrate, and bonded to the package cover with a spacer positioned around the perimeter of the flat substrate so as to provide a space therebetween for housing the microstructure devices, which will not be disclosed in detail herein.

In the microstructure package where the substrate of the microstructure device is directly attached and bonded to the package substrate, deformation may occur due to the force arising from built in stresses in the microstructure devices, the adhesive between the device substrate and the package substrate, and the package, or due to thermally generated stresses (i.e. those arising from CTE mismatches of the components coupled with a temperature change). For this reason, a package insert can be employed. Specifically, additional substrate(s) can be inserted between the substrate of the microstructure and the package substrate, as set forth in U.S. patent application Ser. No. 10/698,656 filed Oct. 30, 2003, the subject matter being incorporated herein by reference.

In addition to the insert substrate, the deformation can be further reduced by providing compliant adhesive material used for bonding the substrate of the microstructure device to the package substrate. According to the invention, the adhesive material comprises a compliant component (e.g. epoxy) whose modulus is 2 GPa or less, preferably 0.5 GPa or less. The thermo-conductivity of such component is preferably 0.5 W/m/K, more preferably 2 W/m/K or higher. Examples of such adhesive component are listed in Table 1.

TABLE 1

| Manufacture | Adhsive | Part No. | Modulus | Thermo-Conductivity |
|---|---|---|---|---|
| Cookson Electronics | Staystik | 171/571 (Ag filter) | 0.4 GPa | 3 W/m/K |
| | | 1172 (BN filter) | 0.4 GPa | 9 W/m/K |
| Ablebond | Ableflex | 5302CE | 1 GPa | 1 W/m/K |
| Tra-con | Supertherm | 816H01 | 80 shore D hardness | 2 W/m/K |
| Dow-Corning | | DA6501 | 20 GPa | 4.4 W/m/K |
| Loctite | | QM1506 | 0.35 GPa | 1 W/m/K |
| Loctite | | QM1516 | 0.8 GPa | 3 W/m/K |

The compliant adhesive component may also be used, for example, mixed with other materials, such as bonding beads or other stiff bonding materials. Specifically, the compliant adhesive component can be used along with a small portion (e.g. 10% or less in volume, or 1% or less in volume) of stiff bonding beads.

Figure 3:
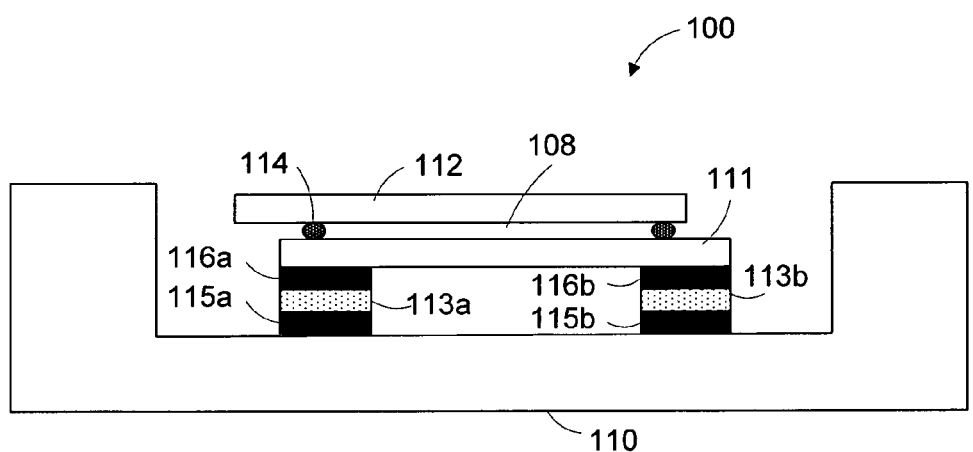
FIGS. 3 through 6 illustrate cross-sectional views of a micromirror array device in accordance with embodiments of the present invention.

The adhesive having the compliant adhesive component as discussed above can be applied to the package and microstructure device in many ways, one of which is illustrated in FIG. 3.

Referring to FIG. 3, the microstructure device comprises substrates 112 and 111, which are bonded together through sealing material 114 that can be an epoxy mixed with bonding beads. The microstructure device is attached to the supporting surface of package substrate 110 with a stack of bonding layers 116a, 116b, 115a, 115b, 113a, and 113b. Bonding layer 113a and 113b are substrate inserts, as those inserts set forth in U.S. patent application Ser. No. 10/698,656 filed Oct. 30, 2003 for reducing the deformation and/or improving dissipation of heat from the microstructure to the package substrate.

Between inserts 113a and 113b, adhesive layers 116a and 116b, each comprising a compliant adhesive component (e.g. compliant epoxy), are respectively positioned between the inserts and the lower substrate 111 of the microstructure device. The inserts are bonded to the supporting surface of the package substrate with adhesive materials 115a and 115b, each of which comprises a compliant adhesive component, such as compliant epoxy.

Alternative to the application of the compliant adhesive component as discussed above, not all adhesive layers 116a, 116b, 115a, and 115b are required to have a compliant adhesive component. For example, either one or both of adhesive layers 115a and 115b have the compliant adhesive component, while either one or both of the adhesive layers 116a and 116b have the compliant adhesive component. For another example, either one or both of adhesive layers 116a and 116b each may have the compliant adhesive component, while either one or both of the adhesive layers 115a and 115b have the compliant adhesive component.

The adhesive layers 115a, 115b, 116a, and 116b, and the inserts 113a and 113b, are discrete stacks disposed along the bonding surface (e.g. the bottom surface of substrate 111 or the supporting surface of the package substrate). Alternatively, the adhesive layers, or the inserts can be a continuous plate. For example, adhesive layers 116a and 116b can be extended and connected into a continuous adhesive film, such as adhesive film 119a in FIG. 4. The inserts 113a and 113b, independent of the adhesive layers 116a, 116b, 115a, and 115b, can also be replaced by a continuous insert plate, such as insert plate 120 in FIG. 4. Similarly, adhesive layers 115a and 115b can also be replaced by a continuous adhesive film, such as adhesive film 119b in FIG. 4, regardless of the detail forms of the inserts and adhesive layers 116a and 116b.

Figure 4:
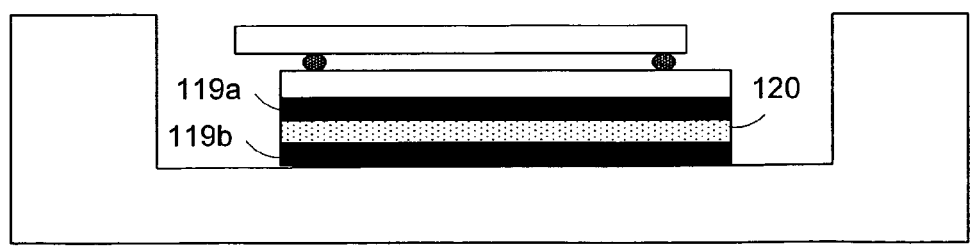

In another example, the microstructure is attached and bonded to the supporting surface of the package substrate through multiple continuous adhesive films and an insert plate, as illustrated in FIG. 4. Specifically, the lower substrate of the microstructure device is bonded to the supporting surface of the package substrate through adhesive layers 119a and 119b and the insert plate 120. The insert plate can be the same insert 113a and/or 113b in FIG. 3. Either one or both of the adhesive layers 119a and 119b comprise a compliant adhesive component as discussed in proceeding sections.

Figure 5:
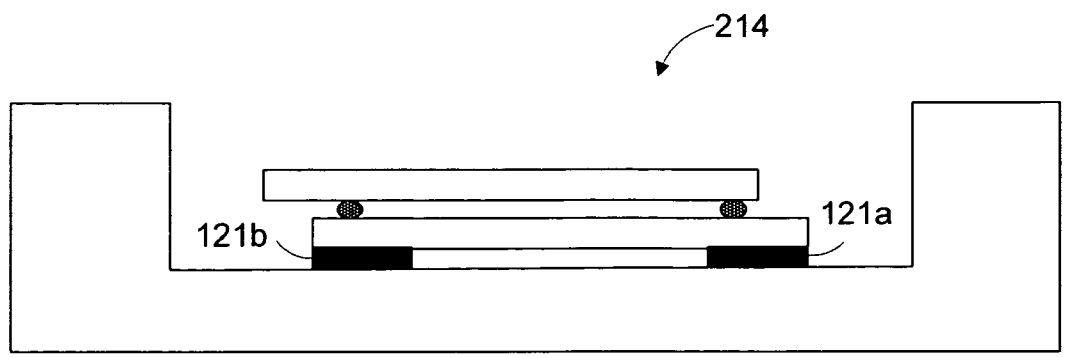

In accordance with another embodiment of the invention, the microstructure device can be attached and bonded to the supporting surface of the package substrate without usage of the insert, as shown in FIG. 5.

Figure 6:
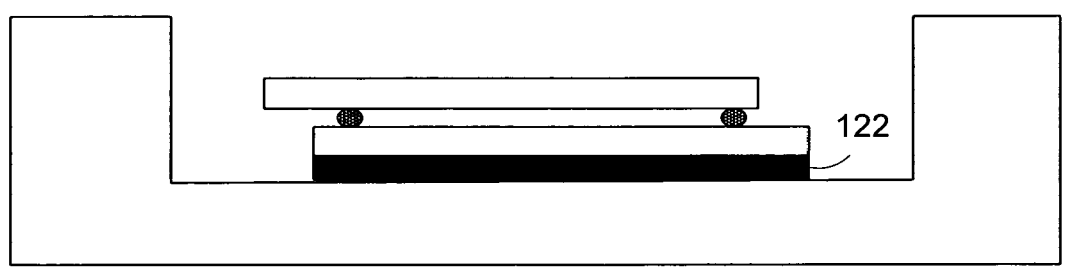

Referring to FIG. 5, the lower substrate of the microstructure device is bonded to the package substrate via adhesive layers 121a and 121b, either or both comprise a compliant adhesive component of the invention. Alternatively, the layers can be replaced by a continuous adhesive film that comprises a compliant adhesive component of the invention, as shown in FIG. 6.

For a given bonding configuration as discussed above, the adhesive material having the compliant adhesive component can be applied in many ways. For demonstration purposes, an example for bonding the microstructure to the package substrate according to the configuration in FIG. 6 with the adhesive layer (122) comprising Cookson's staystik 1172. In this example, the microstructure is a double substrate micromirror array device with the micromirrors formed on one substrate and the addressing electrodes formed on the other substrate. The gap between the two substrates is preferably to be maintained at 1 to 20 microns, and the thickness of each of the two substrates is preferably from 50 microns to 2 mm.

In the bonding process, the thermoplastic adhesive film is cut to size, and then the micromirror array device and the adhesive film are aligned to the package. All 3 pieces (including the two substrates of the micromirror array device and adhesive film 122) are heated to 170° (temperatures in the range of 125-200° C. are acceptable), and a pressure of 5 psi (1 to 10 psi are acceptable) is applied for 20 seconds (10 to 60 seconds are acceptable). The package is allowed to cool and the packaging process can continue (e.g. wirebonding, dehydration, insertion of getter material and lubricant followed by hermetic sealing in an inert environment).

Of course, other epoxies (or other adhesives) meeting the specifications of this invention could be used instead of the one given in this example. In such cases, the relevant attachment procedure should be followed.

In view of the many possible embodiments to which the principles of this invention may be applied, however, it should be recognized that the embodiments described herein with respect to the drawing figures are meant to be illustrative only and should not be taken as limiting the scope of invention. For example, in addition to the adhesives listed, any compliant (Young's Modulus<1 GPa) and thermally conductive (>0.5 W/m/K) adhesive could be used. Also, the thickness of the adhesive could be optimized to balance gap uniformity and heat transfer. Thinner adhesives give better heat transfer but are effectively stiffer and consequently reduce gap uniformity.

Another alternative embodiment of this invention is that there could be any number of strips of adhesives attaching the die to the package instead of the 1 or 2 described here. Additionally, the adhesive strips can be positioned in any direction, such as along the length and/or width or any other direction. Furthermore, the adhesive could be a thermoplastic (such as a staystik material), a silicone polymer (such as a Dow Cornin material), or an epoxy (such as a Tra-con material). The adhesive preferably comprises organics or a hybrid organic/inorganic material. Moreover, while single component adhesives are preferred, multi-component adhesives could be used.

As another alternative embodiment of the present invention, the filler could be Ag, A1N, BN, or any convenient thermally conductive filler material. The filler material could also be electrically conductive, such as Ag, Au, C, C fibers or nanotubes, or any other convenient electrically conductive material. Additionally, a liquid could be encased beneath the die inside of a ring of adhesives. This would increase heat transfer without affecting gap uniformity. Furthermore, the packages need not be hermetic. The device need not be a microdisplay. The Si insert could instead be any inert solid.

The invention has been described in terms of specific embodiments. Nevertheless, persons familiar with the field will appreciate that many variations exist in light of the embodiments described herein.

We claim:

1. A packaged device, comprising:
a microstructure device having a device substrate;
a package substrate on which the microstructure device is attached; and
an adhesive layer disposed between the device substrate and the package substrate for bonding the two substrates, wherein the adhesive layer comprises a adhesive component having a modulii of 2 GPa or lower.

2. The packaged device of claim 1, wherein the microstructure comprises an array of deflectable reflective micromirrors.

3. The packaged device of claim 2, wherein the adhesive component has a modulus of 0.5 GPa or lower.

4. The packaged device of claim 2, wherein the adhesive component has a thermo-conductivity of 0.5 W/m/K or higher.

5. The packaged device of claim 2, wherein the adhesive component has a thermo-conductivity of 2 W/m/K or higher.

6. The packaged device of claim 2, wherein the adhesive component has the Young's modulus of 1 GPa or less.

7. The packaged device of claim 2, wherein the adhesive layer is a thermoplastic.

8. The packaged device of claim 2, wherein the adhesive layer is a silicone polymer.

9. The packaged device of claim 2, wherein the adhesive layer is an epoxy.

10. The packaged device of claim 2, wherein the adhesive layer further comprises a filler that is electrically conductive.

11. The packaged device of claim 10, wherein the filler comprises a material selected from Ag, AlN, BN, Au, C, C filbers or nanotubes.

12. The packaged device of claim 11, wherein the filler comprises Au.

13. The packaged device of claim 11, wherein the filler comprises Ag.

14. The packaged device of claim 11, wherein the filler comprises BN.

15. The packaged device of claim 11, wherein the filler comprises C.

16. The packaged device of claim 11, wherein the filler comprises AlN.

17. The packaged device of claim 10, wherein the adhesive material is a ring around the perimeter of the device substrate.

18. The packaged device of claim 17, further comprising: a layer of water within the ring.

19. The packaged device of claim 2, further comprising: an insert plate positioned between the device package and device package.

20. The packaged device of claim 19, wherein the adhesive layer is below the device package; the insert plate is below the adhesive layer; and the package substrate is below the insert plate.

21. The packaged device of claim 20, further comprising: another adhesive layer between the insert plate and the package substrate.

22. The packaged device of claim 2, wherein the adhesive layer is a continuous film that directly bonding the device substrate to the package substrate.

23. The packaged device of claim 2, wherein the adhesive layer comprises a plurality of discrete segments each of which directly bonds the device substrate to the package substrate.

24. The packaged device of claim 19, wherein the insert plate is a silicon plate.

25. The packaged device of claim 2, further comprising: a package cover that is bonded to the package substrate with the micromirror array device being sealed within a space between the package cover and the package substrate.

26. The packaged device of claim 25, wherein the package cover is hermetically bonded to the package substrate.

27. The packaged device of claim 25, wherein the package cover is not hermetically bonded to the package substrate.

28. The packaged device of claim 25, wherein the package substrate comprises a cavity in which the micromirror array device is positioned.

29. The packaged device of claim 25, wherein the package substrate is a flat plate that is bonded to the package cover through spacer.

30. The packaged device of claim 1, further comprises: a gutter.

31. The packaged device of claim 1, further comprises: a lubricant.

32. The packaged device of claim 1, wherein the package substrate further comprises an integral heater for producing localized heat.

33. The packaged device of claim 1, wherein the device substrate is a silicon substrate.

34. The packaged device of claim 1, wherein the package substrate is ceramic.

35. The packaged device of claim 1, wherein the adhesive comprises an organic adhesive material.

36. A method of packaging a microstructure device having a device substrate with a package having a package substrate, comprising:
preparing an adhesive material comprising a adhesive component having a modulus of 2 GPa or lower;
depositing the prepared adhesive material to either one or both of the device substrate and the package substrate; and
bonding the device substrate to the package substrate with the deposited adhesive material.

37. The method of claim 36, wherein the microstructure comprises an array of deflectable reflective micromirrors.

38. The method of claim 37, wherein the adhesive component has a modulus of 0.5 GPa or lower.

39. The method of claim 37, wherein the adhesive component has a thermo-conductivity of 0.5 W/m/K or higher.

40. The method of claim 37, wherein the adhesive component has a thermo-conductivity of 2 W/m/K or higher.

41. The method of claim 37, wherein the adhesive component has the Young's modulus of 1 GPa or less.

42. The method of claim 37, wherein the adhesive layer is a thermoplastic.

43. The method of claim 37, wherein the adhesive layer is a silicone polymer.

44. The method of claim 37, wherein the adhesive layer is an epoxy.

45. The method of claim 37, wherein the adhesive layer further comprises a filler that comprises a material selected from Ag, AlN, BN, Au, C, C filbers or nanotubes.

46. The method of claim 36, further comprising: a gutter.

47. The method of claim 36, further comprising: a lubricant.

48. The method of claim 36, wherein the package substrate further comprises an integral heater for producing localized heat.

49. A spatial light modulator, comprising:
an array of microstructure devices having a device substrate;
a package substrate on which the microstructure device is attached; and
an adhesive layer disposed between the device substrate and the package substrate for bonding the two substrates, wherein the adhesive layer comprises a adhesive component having a modulii of 2 GPa or lower.

50. The spatial light modulator of claim 49, wherein the adhesive component has a modulus of 0.5 GPa or lower.

51. The spatial light modulator of claim 49, wherein the adhesive component has a thermo-conductivity of 0.5 W/m/K or higher.

52. The spatial light modulator of claim 51, wherein the adhesive component has a thermo-conductivity of 2 W/m/K or higher.

53. The spatial light modulator of claim 51, wherein the adhesive component has the Young's modulus of 1 GPa or less.

54. The spatial light modulator of claim 49, wherein the adhesive layer is an organic material.

55. The spatial light modulator of claim 49, wherein the adhesive layer is a thermoplastic.

56. The spatial light modulator of claim 49, wherein the adhesive layer is a silicone polymer.

57. The spatial light modulator of claim 49, wherein the adhesive layer is an epoxy.

* * * * *